US005669144A

United States Patent [19]

Hahn et al.

[11] Patent Number: 5,669,144

[45] **Date of Patent: *Sep. 23, 1997**

[54] RAZOR BLADE TECHNOLOGY

[75] Inventors: Steve Syng-Hi Hahn, Wellesley; John Madeira, Assonet; Chong-ping Peter Chou, Lexington, all of N.C.; Lamar Eugene Brooks, North Providence, R.I.

[73] Assignee: The Gillette Company, Boston, Mass.

[ * ] Notice: The term of this patent shall not extend beyond the expiration date of Pat. No. 5,232,568.

[21] Appl. No.: 554,798

[22] Filed: Nov. 7, 1995

Related U.S. Application Data

[63] Continuation of Ser. No. 399,625, Mar. 7, 1995, abandoned, which is a continuation of Ser. No. 157,747, Nov. 24, 1993, abandoned, which is a continuation-in-part of Ser. No. 39,516, Mar. 29, 1993, abandoned, which is a continuation of Ser. No. 792,427, Nov. 15, 1991, abandoned.

[51] Int. Cl.$^{6}$ .............................. B26B 21/54; C23C 14/34

[52] U.S. Cl. ...................................... 30/346.54; 30/346.53; 30/346.55; 204/192.15; 204/192.3

[58] Field of Search .................................... 30/50, 346.53, 30/346.54, 346.55, 350; 204/192.3; 76/104.1, 116, DIG. 8

[56] References Cited

U.S. PATENT DOCUMENTS

| | | | |
|---|---|---|---|
| D. 30,106 | 10/1899 | Polk et al. . | |
| 3,652,443 | 3/1972 | Fish . | |
| 3,743,551 | 7/1973 | Sanderson . | |
| 3,761,372 | 9/1973 | Sastri . | |
| 3,774,703 | 11/1973 | Sanderson | 30/346.53 |
| 3,829,969 | 8/1974 | Fischbein et al. . | |
| 3,835,537 | 9/1974 | Sastri . | |
| 3,900,636 | 8/1975 | Curry et al. . | |
| 3,961,103 | 6/1976 | Aisenberg . | |
| 4,416,912 | 11/1983 | Bache . | |
| 4,434,188 | 2/1984 | Kamo . | |
| 4,470,895 | 9/1984 | Coad et al. . | |
| 4,486,286 | 12/1984 | Lewin et al. . | |
| 4,490,229 | 12/1984 | Mirtich et al. . | |
| 4,504,519 | 3/1985 | Zelez . | |
| 4,586,255 | 5/1986 | Jacobson . | |
| 4,621,424 | 11/1986 | Jacobson . | |
| 4,720,918 | 1/1988 | Curry et al. . | |
| 4,767,517 | 8/1988 | Hiraki et al. . | |
| 4,816,286 | 3/1989 | Hirose . | |
| 4,816,291 | 3/1989 | Despandey . | |
| 4,822,466 | 4/1989 | Rabalais . | |
| 4,842,945 | 6/1989 | Ito et al. . | |
| 4,844,785 | 7/1989 | Kitabatake et al. . | |
| 4,849,290 | 7/1989 | Fujimori . | |

(List continued on next page.)

FOREIGN PATENT DOCUMENTS

| | | |
|---|---|---|
| 351 093 B1 | 1/1990 | European Pat. Off. . |
| 1350 594 | 4/1974 | United Kingdom . |
| WO/90/03455 | 4/1990 | WIPO . |
| WO92/17323 | 10/1992 | WIPO . |

OTHER PUBLICATIONS

Wehner, Gottfried, "Influence of the Angle of Incidence on Sputtering Yields", Journal of Applied Physics, vol. 10, No. 11, Nov. 1959, pp. 1762–1765.

Knight et al. "Characterization of diamond films by Raman spectroscopy", J. Mater. Res., vol. 4, No. 2 Mar./Apr. 1989.

*Primary Examiner*—Hwei-Siu Payer
*Attorney, Agent, or Firm*—Fish & Richardson P.C.

[57] ABSTRACT

A razor blade includes a substrate with a wedge-shaped edge at a distance of forty micrometers from the sharpened tip, and a layer of diamond or diamond-like material defined by facets that have an included angle of less than seventeen degrees that has a thickness of at least twelve hundred angstroms from the sharpened tip of said substrate to a distance of forty micrometers from the sharpened tip, and an ultimate tip defined by facets that have lengths of at least about 0.1 micrometer and define an included angle of at least sixty degrees, and that defines a tip radius of less than about 400 angstroms, an aspect ratio in the range of 1:1–3:1, a hardness of at least thirteen gigapascals and an L5 wet wool felt cutter force of less than 0.8 kilogram.

29 Claims, 1 Drawing Sheet

U.S. PATENT DOCUMENTS

| | | | |
|---|---|---|---|
| 4,871,434 | 10/1989 | Munz et al. . | |
| 4,884,476 | 12/1989 | Okuzumi et al. . | |
| 4,902,535 | 2/1990 | Garg . | |
| 4,933,058 | 6/1990 | Bache et al. . | |
| 4,940,180 | 7/1990 | Martell . | |
| 4,973,388 | 11/1990 | Francois et al. . | |
| 4,988,421 | 1/1991 | Drawl et al. . | |
| 5,032,243 | 7/1991 | Bache et al. . | |
| 5,048,191 | 9/1991 | Hahn . | |
| 5,056,227 | 10/1991 | Kramer . | |
| 5,142,785 | 9/1992 | Grewal et al. . | |
| 5,164,051 | 11/1992 | Komaki et al. . | |
| 5,190,631 | 3/1993 | Windischmann et al. . | |
| 5,232,568 | 8/1993 | Parent et al. | 30/346.54 |
| 5,234,561 | 8/1993 | Randhawa et al. . | |
| 5,295,305 | 3/1994 | Hahn et al. | 30/346.53 |
| 5,497,550 | 3/1996 | Trotta et al. | 30/346.55 |

RAZOR BLADE TECHNOLOGY

This is a continuation of application Ser. No. 08/399,625, filed Mar. 7, 1995, now abandoned, which is a continuation of application Ser. No. 08/157,747, filed Nov. 24, 1993, now abandoned, which is a continuation-in-part of application Ser. No. 08/039,516 filed Mar. 29, 1993, now abandoned, which is a continuation of application Ser. No. 07/792,427, filed Nov. 15, 1991, now abandoned.

This invention relates to improved razors and razor blades and to processes for producing razor blades or similar cutting tools with sharp and durable cutting edges.

A razor blade typically is formed of a suitable substrate material such as metal or ceramic and an edge is formed with wedge-shape configuration with an ultimate edge or tip that has a radius of less than about 1,000 angstroms. During use, a razor blade is held in the razor at an angle of approximately 25°, and with the wedge-shaped edge in contact with the skin, it is moved over the face so that when the edge encounters a beard hair, it enters and severs it by progressive penetration, aided by a wedging action. It is believed that the cut portion of the hair (which on average is about 100 micrometers in diameter) remains pressed in contact with the blade facets remote from the facial skin surface for a penetration up to only about half the hair diameter. Beyond this, the hair can bend and contract away from the blade to relieve the wedging forces. The resistance to penetration through reaction between hair and blade facets therefore occurs only over about the first sixty micrometers of the blade tip back from the edge and the geometry of the blade tip in this region is regarded as being the most important from the cutting point of view.

It is believed that a reduction in the included angle of the facets would correspondingly reduce the resistance to continued penetration of the blade tip into the hair. However, when the included angle is reduced too much, the strength of the blade tip is inadequate to withstand the resultant bending forces on the edge during the cutting process and the tip deforms plastically (or fractures in a brittle fashion, dependent on the mechanical properties of the material from which it is made) and so sustains permanent damage, which impairs its subsequent cutting performance, i.e. the edge becomes "blunt" or "dull". As shaving action is severe and blade edge damage frequently results, and to enhance shavability, the use of one or more layers of supplemental coating material has been proposed for shave facilitation, and/or to increase the hardness, strength and/or corrosion resistance of the shaving edge. A number of such coating materials have been proposed, such as polymeric materials, metals and alloys, as well as other materials including diamond and diamond-like carbon (DLC) material. Diamond and diamond-like carbon (DLC) materials may be characterized as having substantial sp3 carbon bonding; a mass density greater than 1.5 grams/cm$^3$; and a Ramanpeak at about 1331 cm$^{-1}$ (diamond) or about 1550 cm$^{-1}$ (DLC). Each such layer or layers of supplemental material desirably provides characteristics such as improved shavability, improved hardness, edge strength and/or corrosion resistance while not adversely affecting the geometry and cutting effectiveness of the shaving edge.

In accordance with one aspect of the invention, there is provided a razor blade comprising a substrate with a wedge-shaped edge with an included facet angle in the range of 10°–17° in the region from forty to one hundred micrometers from the substrate tip, and a layer of strengthening material on the wedge-shaped edge that is preferably at least twice as hard as the underlying substrate, and has a thickness of at least about 1200 angstroms, defines a tip of radius of less than about 400 angstroms that is defined by tip facets with an included angle of at least 60°, and has an aspect ratio in the range of 1:1–3:1. The blade exhibits excellent shaving properties and long shaving life.

In particular embodiments, the razor blade substrate is steel; the wedge-shaped edge is formed by a sequence of mechanical abrading steps; a layer of diamond-like carbon material is formed by sputtering material from a high purity target of graphite concurrently with the application of an RF bias to the steel substrate, the DLC layer having a thickness in the range of twelve hundred to eighteen hundred angstroms and a hardness of at least thirteen gigapascals; and the blade edge has excellent edge strength as evidenced by an L5 wet wool felt cutter force of less than 0.8 kilogram, and negligible dry wool felt cutter edge damage (less than fifty small damage regions (each such small damage region being of less than twenty micrometer dimension and less than ten micrometer depth) and no damage regions of larger dimension or depth) as microscopically assessed.

In accordance with another aspect of the invention, there is provided a process for forming a razor blade that includes the steps of providing a substrate, forming on an edge of the substrate a wedge-shaped sharpened edge that has an included angle of less than 17° and a tip radius (i.e. the estimated radius of the larger circle that may be positioned within the ultimate tip of the edge when such ultimate tip is viewed under a scanning electron microscope at magnifications of at least 25,000) preferably of less than 1,000 angstroms; and depositing a layer of strengthening material of at least about 1200 Angstroms thickness on the wedge-shaped edge of the substrate to provide an aspect ratio in the range of 1:1–3:1, and a radius at the ultimate tip of the strengthening material of less than about 400 angstroms that is defined by tip facets with an included angle of at least 60°.

In particular processes, the substrate is mechanically abraded in a sequence of honing steps to form the sharpened edge; a layer of molybdenum or niobium followed by a layer of diamond or diamond-like carbon material are deposited by sputtering; the molybdenum or niobium layer having a thickness of less than about five hundred angstroms, and the diamond or DLC coating on the molybdenum or niobium coated cutting edge having a thickness of at least about twelve hundred angstroms and less than eighteen hundred angstroms; the layer of diamond having a Raman peak at about 1331 cm$^{-1}$ and the layer of diamond-like carbon (DLC) material having a Raman peak at about 1550 cm$^{-1}$; substantial sp3 carbon bonding; and a mass density greater than 1.5 grams/cm$^3$; and an adherent polymer coating is applied on the diamond or DLC coated cutting edge.

In accordance with another aspect of the invention, there is provided a shaving unit that comprises blade support structure that has external surfaces for engaging user skin ahead and rearwardly of the blade edge or edges and at least one blade member secured to the support structure. The razor blade structure secured to the support structure includes a substrate with a wedge-shaped cutting edge defined by facets that have an included angle of less than seventeen degrees at a distance of forty micrometers from the sharpened tip, and a layer of strengthening material on the wedge-shaped cutting edge that has a thickness of at least twelve hundred angstroms and less than eighteen hundred angstroms from the sharpened tip of said substrate to a distance of forty micrometers from the sharpened tip, and an ultimate tip defined by facets that have lengths of at least about 0.1 micrometer and define an included angle of at least sixty degrees, a radius at the ultimate tip of the strengthening material of less than 400 angstroms and an aspect ratio in the range of 1:1–3:1.

In a particular shaving unit, the razor blade structure includes two steel substrates, the wedge-shaped edges are disposed parallel to one another between the skin-engaging surfaces; a molybdenum or niobium interlayer is between the steel substrate and the edge strengthening layer and the edge strengthening layer is of diamond or DLC material; each interlayer has a thickness of less than about five hundred angstroms; each diamond or DLC coating has a thickness of at least about twelve hundred angstroms and less than eighteen hundred angstroms; substantial sp3 carbon bonding; a mass density greater than 1.5 grams/$cm^3$; and a Raman peak at about 1331 $cm^{-1}$ (diamond) or about 1550 $cm^{-1}$ (DLC); and an adherent polymer coating is on each layer of diamond or diamond-like carbon material.

The shaving unit may be of the disposable cartridge type adapted for coupling to and uncoupling from a razor handle or may be integral with a handle so that the complete razor is discarded as a unit when the blade or blades become dull. The front and rear skin engaging surfaces cooperate with the blade edge (or edges) to define the shaving geometry. Particularly preferred shaving units are of the types shown in U.S. Pat. No. 3,876,563 and in U.S. Pat. No. 4,586,255.

Other features and advantages of the invention will be seen as the following description of particular embodiments progresses, in conjunction with the drawings, in which.

DESCRIPTION OF PARTICULAR EMBODIMENTS

Figure 1:
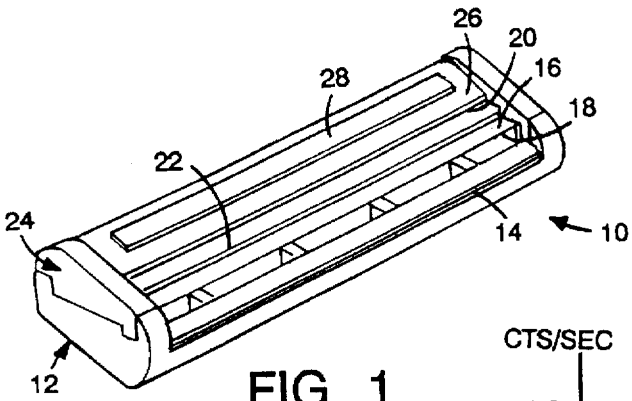
FIG. 1 is a perspective view of a shaving unit in accordance with the invention.
Figure 5:
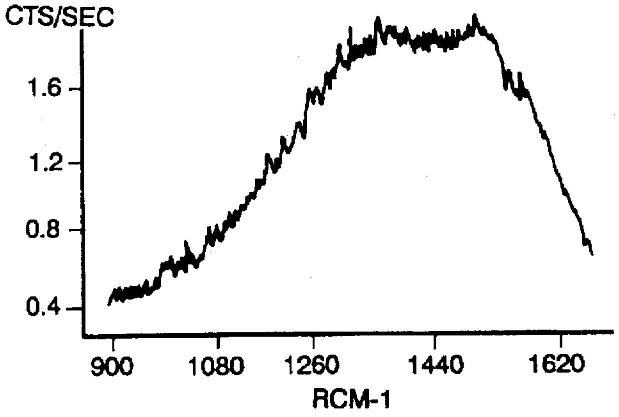
FIG. 5 is a Raman spectrum of DLC material deposited with the apparatus of FIG. 4.

With reference to FIG. 1, shaving unit 10 includes structure for attachment to a razor handle, and a platform member 12 molded of high-impact polystyrene that includes structure defining forward, transversely-extending skin engaging surface 14. Mounted on platform member 12 are leading blade 16 having sharpened edge 18 and following blade 20 having sharpened edge 22. Cap member 24 of molded high-impact polystyrene has structure defining skin-engaging surface 26 that is disposed rearwardly of blade edge 22, and affixed to cap member 24 is shaving aid composite 28.

Figure 2:
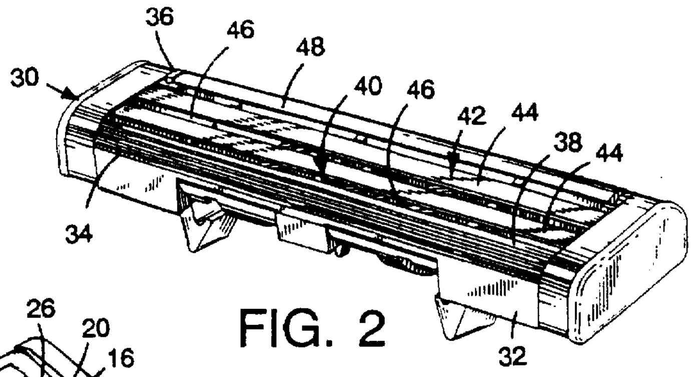
FIG. 2 is a perspective view of another shaving unit in accordance with the invention.

The shaving unit 30 shown in FIG. 2 is of the type shown in Jacobson U.S. Pat. No. 4,586,255 and includes molded body 32 with front portion 34 and rear portion 36. Resiliently secured in body 32 are guard member 38, leading blade unit 40 and trailing blade unit 42. Each blade unit 40, 42 includes a blade member 44 that has a sharpened edge 46. A shaving aid composite 48 is frictionally secured in a recess in rear portion 36.

Figure 3:
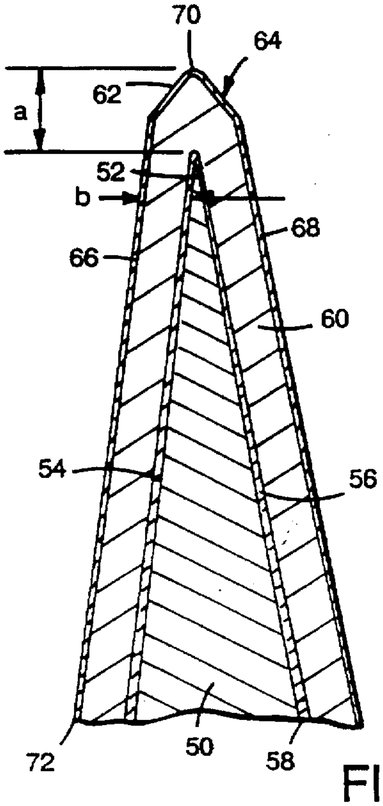
FIG. 3 is a diagrammatic view illustrating one example of razor blade edge geometry in accordance with the invention.

A diagrammatic view of the edge region of the blades 16, 20 and 44 is shown in FIG. 3. The blade includes stainless steer body portion 50 with a wedge-shaped sharpened edge formed in a sequence of edge forming honing operations that forms a tip portion 52 that has a radius typically less than 500 angstroms with facets 54 and 56 that diverge at an angle of about 13°. Deposited on tip 52 and facets 54, 56 is interlayer 58 of molybdenum or niobium that has a thickness of about 300 angstroms. Deposited on interlayer 58 is outer layer 60 of diamond-like carbon (DLC) that has a thickness of less than about 2,000 angstroms, with facets 62, 64 that have lengths of about one-quarter micrometer each and define an included angle of about 80°, facets 62, 64 merging with main facet surfaces 66, 68 that are disposed at an included angle of about 13° and an aspect ratio (the ratio of the distance (a) from DLC tip 70 to stainless steel tip 52 and the width (b) of the DLC coating 60 at tip 52) of about 1.7. Deposited on layer 60 is an adherent telomer layer 72 that has a substantial as deposited thickness but is reduced to monolayer thickness during initial shaving.

Figure 4:
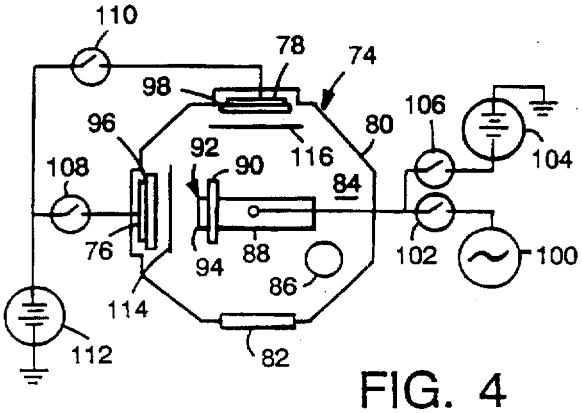
FIG. 4 is a diagrammatic view of apparatus for the practice of the invention.

Apparatus for processing blades of the type shown in FIG. 3 is diagrammatically illustrated in FIG. 4. That apparatus includes a DC planar magnetron sputtering system manufactured by Vac Tec Systems of Boulder, Colo. that has stainless steel chamber 74 with wall structure 80, door 82 and base structure 84 in which is formed port 86 coupled to a suitable vacuum system (not shown). Mounted in chamber 74 is carousel support 88 with upstanding support member 90 on which is disposed a stack of razor blades 92 with their sharpened edges 94 in alignment and facing outwardly from support 90. Also disposed in chamber 74 are support structure 76 for interlayer target member 96 of molybdenum or niobium (99.99% pure) and support structure 78 for target member 98 of graphite (99.999% pure). Targets 96 and 98 are vertically disposed plates, each about twelve centimeters wide and about thirty-seven centimeters long. Support structures 76, 78 and 88 are electrically isolated from chamber 74 and electrical connections are provided to connect blade stack 92 to RF power supply 100 through switch 102 and to DC power supply 104 through switch 106; and targets 96 and 98 are connected through switches 108, 110, respectively, to DC magnetron power supply 112. Shutter structures 114 and 116 are disposed adjacent targets 96, 98, respectively, for movement between an open position and a position obscuring its adjacent target.

Carousel 88 supports the blade stack 92 with the blade edges 94 spaced about seven centimeters from the opposed target plate 96, 98 and is rotatable about a vertical axis between a first position in which blade stack 92 is in opposed alignment with interlayer target 96 (FIG. 4) and a second position in which blade stack 92 is in opposed alignment with graphite target 98.

In a particular processing sequence, a stack of stainless steel blades 92 (thirty centimeters high) is secured on support 90 (together with three polished stainless steel blade bodies disposed parallel to the target); chamber 74 is evacuated; the targets 96, 98 are cleaned by DC sputtering for five minutes; switch 102 is then closed and the blades 92 are RF cleaned in an argon environment for three minutes at a pressure of ten millitorr, an argon flow of 200 sccm and a power of 1.5 kilowatts; the argon flow is then reduced to 150 sccm at a pressure of 4.5 millitorr in chamber 74; switch 106 is closed to apply a DC bias of −50 volts on blades 92; switch 108 is closed to sputter at one kilowatt power and shutter 114 in front of interlayer target 96 is opened; for twenty-eight seconds to deposit a molybdenum layer 58 of about 300 angstroms thickness on the blade edges 94. Shutter 114 is then closed, switches 106 and 108 are opened, and carousel 88 is rotated 90° to juxtapose blade stack 92 with graphite target 98. Pressure in chamber 74 is reduced to two millitorr with an argon flow of 150 sccm; switch 110 is closed to sputter graphite target 98 at 500 watts; switch 102 is closed to apply a 13.56 MHz RF bias of one thousand watts (−440 volts DC self bias voltage) on blades 92, and concurrently shutter 116 is opened for twenty minutes to deposit a DLC layer 60 of about two thousand angstroms thickness on molybdenum layer 58. The DLC coating 60 had a radius at tip 70 of about 250 Angstroms that is defined by facets 62, 64 that have an included angle of about 80°, an aspect ratio of about 1.7:1, and a hardness (as measured on the planar surface of an adjacent stainless steel blade body with a Nanoindenter X instrument to a depth of five hundred angstroms) of about seventeen gigapascals (the stainless steel blade body having a hardness of about eight gigapascals).

A coating 72 of polytetrafluoroethylene telomer is then applied to the DLC-coated edges of the blades. The process involves heating the blades in a neutral atmosphere of argon and providing on the cutting edges of the blades an adherent and friction-reducing polymer coating of solid PTFE. Coatings 58 and 60 were firmly adherent to the blade body 50 and provided low wet wool felt cutter force (the lowest of the first five cuts with wet wool felt (L5) being about 0.45 kilogram), and withstood repeated applications of wool felt cutter forces (the lowest cutter force of the 496–500 cuts being about 0.65 kilogram), indicating that the DLC coating 60 is substantially unaffected by exposure to the severe conditions of this felt cutter test and remains firmly adhered to the blade body 50. Edge damage and delamination after ten cuts with dry wool felt as determined by microscopic assessment was substantially less than commercial chrome-platinum coated blades, there being less than four small edge damage regions (each such small damage region being of less than twenty micrometer dimension and less than ten micrometer depth) and no damage regions of larger dimension or depth. Resulting blade elements 44 were assembled in cartridge units 30 of the type shown in FIG. 2 and shaved with excellent shaving results.

In another particular processing sequence, a stack (thirty centimeters high) of sharpened stainless steel blades 92 (fifteen degree included angle at forty micrometers from edge tip and a tip radius of about 200 angstroms) is secured on support 90 (together with three polished stainless steel blade bodies disposed parallel to the target); chamber 74 is evacuated; niobium and graphite targets 96, 98 are cleaned by DC sputtering for five minutes; switch 102 is then closed and the blades 92 are RF cleaned in an argon environment for five minutes at a pressure of ten millitorr, an argon flow of 200 sccm and a power of 1.5 kilowatts; the argon flow is then reduced to 150 sccm at a pressure of 2 millitorr in chamber 74; switch 106 is closed to apply a DC bias of −50 volts on blades 92; switch 108 is closed to sputter at one kilowatt power and shutter 114 in front of niobium target 96 is opened; for twenty seconds to deposit a niobium layer 58 of about 200 angstroms thickness on the blade edges 94. Shutter 114 is then closed, switches 106 and 108 are opened, and carousel 88 is rotated 90° to juxtapose blade stack 92 with graphite target 98. Pressure in chamber 74 is kept to two millitorr with an argon flow of 150 sccm; switch 110 is closed to sputter graphite target 98 at 500 watts; switch 102 is closed to apply a 13.56 MHz RF bias of one thousand watts (−440 volts DC self bias voltage) on blades 92, and concurrently shutter 116 is opened for twenty minutes to deposit a DLC layer 60 of about 1,400 angstroms thickness on niobium layer 58. The DLC coating 60 had a radius at tip 70 of about 300 Angstroms that is defined by facets 62, 64 that have an included angle of about 80°, an aspect ratio of about 1.6:1, and a hardness (as measured on the planar surface of an adjacent stainless steel blade body with a Nanoindenter X instrument to a depth of five hundred angstroms) of about seventeen gigapascals (the stainless steel blade body having a hardness of about eight gigapascals).

A coating 72 of polytetrafluoroethylene telomer is then applied to the DLC-coated edges of the blades as described above. Coatings 58 and 60 were firmly adherent to the blade body 50 and provided low wet wool felt cutter force (the lowest of the first five cuts with wet wool felt (L5) being about 0.45 kilogram), and withstood repeated applications of wool felt cutter forces (the lowest cutter force of the 496–500 cuts being about 0.6 kilogram), indicating that the DLC coating 60 is substantially unaffected by exposure to the severe conditions of this felt cutter test and remains firmly adhered to the blade body 50. Edge damage and delamination after ten cuts with dry wool felt as determined by microscopic assessment was substantially less than commercial chrome-platinum coated blades, there being less than four small edge damage regions (each such small damage region being of less than twenty micrometer dimension and less than ten micrometer depth) and no damage regions of larger dimension or depth. Peak cutting force measurements with these blades on human beard hairs were at least about eleven percent less than peak cutting force measurements of the same type on commercial chrome platinum-coated steel blades. Resulting blade elements 44 were assembled in cartridge units 30 of the type shown in FIG. 2 and shaved with excellent shaving results.

While particular embodiments of the invention has been shown and described, various modifications will be apparent to those skilled in the art, and therefore, it is not intended that the invention be limited to the disclosed embodiments, or to details thereof, and departures may be made therefrom within the spirit and scope of the invention.

What is claimed is:

1. A razor blade comprising a substrate with a wedge-shaped edge defined by a sharpened tip and facets that have an included angle of less than seventeen degrees at a distance of forty micrometers from the sharpened tip, a layer of interlayer material on the tip and flanks of said wedge-shaped edge, the thickness of said interlayer material being in the range of about 50–500 angstroms, and a layer of diamond or diamond-like carbon material on said interlayer material, said layer of diamond or diamond-like carbon material having a thickness in the range of twelve hundred to eighteen hundred angstroms from the sharpened tip of said substrate to a distance of forty micrometers from the sharpened tip, and an ultimate tip defined by facets that have lengths of at least about 0.1 micrometer and define an included angle of at least sixty degrees, a radius at the ultimate tip of said diamond or diamond-like material of less than 400 angstroms, and an aspect ratio in the range of 1:1–3:1, a hardness of at least thirteen gigapascals and an L5 wet wool felt cutter force of less than 0.8 kilogram, and dry wool felt (ten cuts) edge damage of less than fifty small edge damage regions and no damage regions of larger dimension or depth.

2. The razor blade of claim 1 wherein said substrate is steel; said wedge-shaped edge is formed by a sequence of mechanical abrading steps; and said layers of interlayer material and diamond or diamond-like carbon material are formed by sputtering.

3. A razor blade comprising a substrate with a wedge-shaped edge defined by a sharpened tip and facets that have an included angle of less than seventeen degrees at a distance of forty micrometers from the sharpened tip, a layer of niobium on the tip and flanks of said wedge-shaped edge, the thickness of said niobium layer being in the range of about 50–500 angstroms, and a layer of diamond or diamond-like carbon material on said niobium layer, said layer of diamond or diamond-like carbon material having a thickness in the range of twelve hundred to eighteen hundred angstroms from the sharpened tip of said substrate to a distance of forty micrometers from the sharpened tip, and an ultimate tip defined by facets that have lengths of at least about 0.1 micrometer and define an included angle of at least sixty degrees, a radius at the ultimate tip of said diamond or diamond-like material of less than 400 angstroms, and an aspect ratio in the range of 1:1–3:1, a hardness of at least thirteen gigapascals and an L5 wet wool felt cutter force of less than 0.8 kilogram, and dry wool felt (ten cuts) edge damage of less than fifty small edge damage regions and no damage regions of larger dimension or depth.

4. The razor blade of claim 3 wherein said substrate is steel; said wedge-shaped edge is formed by a sequence of mechanical abrading steps; and said layers of niobium and diamond or diamond-like carbon material are formed by sputtering.

5. The razor blade of claim 4 wherein said layer of diamond or diamond-like carbon (DLC) material has substantial sp3 carbon bonding; a mass density greater than 1.5 grams/$cm^3$; and a Raman peak at about 1331 $cm^{-1}$ (DLC) or about 1550 $cm^{-1}$ (DLC); and further including an adherent polymer coating on said layer of diamond or diamond-like carbon material.

6. A shaving unit comprising support structure that defines spaced skin-engaging surfaces, and razor blade structure secured to said support structure, said razor blade structure including a substrate with a wedge-shaped edge defined by a sharpened tip and facets that have an included angle of less than seventeen degrees at a distance of forty micrometers from the sharpened tip; and a layer of diamond or diamond-like carbon material on said wedge-shaped edge, said layer of diamond or diamond-like material having a thickness in the range of twelve hundred to eighteen hundred angstroms from the sharpened tip of said substrate to a distance of forty micrometers from the sharpened tip, and an ultimate tip defined by facets that have lengths of at least about 0.1 micrometer and define an included angle of at least sixty degrees, a hardness of at least thirteen gigapascals, an L5 wet wool felt cutter force of less than 0.8 kilogram, and dry wool felt (ten cuts) edge damage of less than fifty small edge damage regions and no damage regions of larger dimension or depth, said diamond or diamond-like carbon coated wedge-shaped edge being disposed between said skin-engaging surfaces.

7. The shaving unit of claim 6 wherein said razor blade structure includes two substrates, and said coated wedge-shaped edges are disposed parallel to one another between said skin-engaging surfaces.

8. The shaving unit of claim 7 wherein each said layer of diamond or diamond-like carbon material has substantial sp3 carbon bonding; a mass density greater than 1.5 grams/$cm^3$; and a Raman peak at about 1331 $cm^{-1}$ (diamond) or 1550 $cm^{-1}$ (DLC); and further including an adherent polymer coating on each said layer of diamond or diamond-like carbon material.

9. A razor blade comprising a substrate with a wedge-shaped edge defined by a sharpened tip and facets that have an included angle of less than seventeen degrees at a distance of forty micrometers from the sharpened tip, and a layer of strengthening material on said wedge-shaped edge, said layer of strengthening material being at least twice as hard as said substrate and having a thickness of at least twelve hundred angstroms from the sharpened tip of said substrate to a distance of forty micrometers from the sharpened tip, and an ultimate tip defined by facets that have lengths of at least about 0.1 micrometer and define an included angle of at least sixty degrees, a hardness of at least thirteen gigapascals, an L5 wet wool felt cutter force of less than 0.8 kilogram, dry wool felt (ten cuts) edge damage of less than ten small edge damage regions and no damage regions of larger dimension or depth, a radius at the ultimate tip of said diamond or diamond-like material of less than 400 angstroms and an aspect ratio in the range of 1:1–3:1.

10. The razor blade of claim 9 wherein said layer of strengthening material is diamond or diamond-like carbon (DLC) material and has a Raman peak at about 1331 $cm^{-1}$ (diamond) or about 1550 $cm^{-1}$ (DLC).

11. The razor blade of claim 10 wherein said layer of diamond or diamond-like carbon (DLC) has substantial sp3 carbon bonding; and a mass density greater than 1.5 grams/$cm^3$.

12. The razor blade of claim 10 and further including a layer of niobium on said wedge-shaped edge; said niobium layer having a thickness of less than about five hundred angstroms; and said diamond or DLC coating on said cutting edge has a thickness in the range of twelve hundred to eighteen hundred angstroms.

13. The razor blade of claim 9 and further including an adherent polymer coating on said layer of strengthening material.

14. The razor blade of claim 9 and further including a layer of molybdenum on said wedge-shaped edge; said molybdenum layer having a thickness of less than about five hundred angstroms.

15. A process for forming a razor blade comprising the steps of providing a substrate, forming a wedge-shaped sharpened edge on said substrate that has a sharpened tip and an included angle of less than seventeen degrees at a distance of forty micrometers from the tip of said sharpened tip and a edge radius of less than four hundred angstroms; and sputter depositing a layer of diamond or diamond-like carbon material on said sharpened edge; said layer of diamond or diamond-like carbon material having a thickness of at least twelve hundred angstroms from the sharpened tip of said substrate to a distance of forty micrometers from the sharpened tip, and an ultimate tip defined by facets that have lengths of at least about 0.1 micrometer and define an included angle of at least sixty degrees, a radius at the ultimate tip of said diamond or diamond-like material of less than 400 angstroms and an aspect ratio in the range of 1:1–3:1.

16. The process of claim 15 wherein said substrate is mechanically abraded in a sequence of honing steps to form said sharpened edge.

17. The process of claim 15 and further including the step of applying an adherent polymer coating on said diamond or diamond-like carbon coated sharpened edge.

18. The process of claim 15 and further including the step of depositing a layer of molybdenum on said sharpened edge; and said layer of diamond or diamond-like carbon material is deposited on said molybdenum layer.

19. The process of claim 18 wherein said molybdenum layer on said sharpened edge has a thickness of less than about five hundred angstroms.

20. The process of claim 15 and further including the step of depositing a layer of niobium on said sharpened edge; and said layer of diamond or diamond-like carbon material is deposited on said niobium layer.

21. The process of claim 20 wherein said niobium layer on said cutting edge has a thickness of less than about five hundred angstroms.

22. The process of claim 15 wherein said substrate is of metal and said diamond or diamond-like carbon layer is at least twice as hard as said metal substrate.

23. The process of claim 15 wherein said layer of diamond or diamond-like material is deposited in an argon atmosphere in an evacuated chamber in which a graphite target and a shutter are located; said graphite target is energized; and said shutter is opened to deposit said layer of diamond or diamond-like material on said sharpened edge while an RF bias is applied to said substrate.

24. The process of claim 23 and further including a molybdenum target in said chamber, and further including the step of depositing a molybdenum layer on said sharpened edge.

25. The process of claim 23 and further including a niobium target in said chamber, and further including the step of depositing a niobium layer on said sharpened edge.

26. A process for forming a razor blade comprising the steps of providing a substrate, forming on said substrate a wedge-shaped edge that has a sharpened tip and an included angle of less than seventeen degrees at a distance of forty micrometers from the sharpened tip and a tip radius less than 400 angstroms; and disposing said substrate and a solid target member in a chamber; and sputtering said solid target member to generate carbon atoms for forming a diamond or diamond-like carbon layer on said wedge-shaped edge to provide a thickness of at least twelve hundred angstroms from the sharpened tip of said substrate to a distance of forty micrometers from the sharpened tip, and an ultimate tip defined by facets that have lengths of at least about 0.1 micrometer and define an included angle of at least sixty degrees, a radius at the ultimate tip of said diamond or diamond-like material of less than 400 angstroms and an aspect ratio in the range of 1:1–3:1.

27. The process of claim 26 wherein said layer of diamond or diamond-like material is deposited in an argon atmosphere in an evacuated chamber in which a graphite target and a shutter are located; said graphite target is energized; and said shutter is opened to deposit said layer of diamond or diamond-like material on said sharpened edge.

28. The process of claim 26 wherein said diamond or diamond-like carbon layer on said cutting edge has a thickness in the range of twelve hundred to eighteen hundred angstroms.

29. The process of claim 28 and further including the step of applying an adherent polymer coating on said diamond or diamond-like carbon coated cutting edge.

* * * * *